United States Patent [19]

Loftness

[11] 4,439,723

[45] Mar. 27, 1984

[54] ULTRASONIC AND VHF LOCATOR OF ELECTRICAL SYSTEMS DEFECTS

[76] Inventor: Marvin O. Loftness, 115 W. 20th Ave., Olympia, Wash. 98501

[21] Appl. No.: 262,115

[22] Filed: May 11, 1981

[51] Int. Cl.³ .............................................. G01R 31/02
[52] U.S. Cl. ..................................................... 324/52
[58] Field of Search ................... 324/52, 51, 72.5, 149

[56] References Cited

U.S. PATENT DOCUMENTS

| | | | |
|---|---|---|---|
| 2,142,304 | 1/1939 | Cummings | 324/52 |
| 3,345,560 | 10/1967 | Perkins | 324/52 |
| 3,551,804 | 12/1970 | Weddle | 324/52 |
| 3,820,018 | 6/1974 | Beasley et al. | 324/52 |
| 3,857,091 | 12/1974 | Kalifon | 324/52 |
| 4,072,899 | 2/1978 | Shimp | 324/52 X |
| 4,158,169 | 6/1979 | Harrold et al. | 324/52 |
| 4,316,139 | 2/1982 | Root | 324/52 |

FOREIGN PATENT DOCUMENTS 1172683 12/1969 United Kingdom ................ 324/52

*Primary Examiner*—Stanley T. Krawczewicz

[57] ABSTRACT

An ultrasonic detecting transducer and a VHF detecting antenna for locating electrical systems defects are mounted on a probe housing and connected through an RF detector to an audio amplifier and speaker contained in the housing, the speaker communicating with the adjacent connected end of an elongated, hollow, electrically non-conductive, substantially rigid pole the opposite, outer handle portion of which pole is rotatable relative to the inner portion and is perforated to allow sounds from the speaker to be heard by the operator grasping the handle portion. A switch is provided on the housing for shorting the VHF detecting antenna when the ultrasonic detecting component is to be used.

12 Claims, 5 Drawing Figures

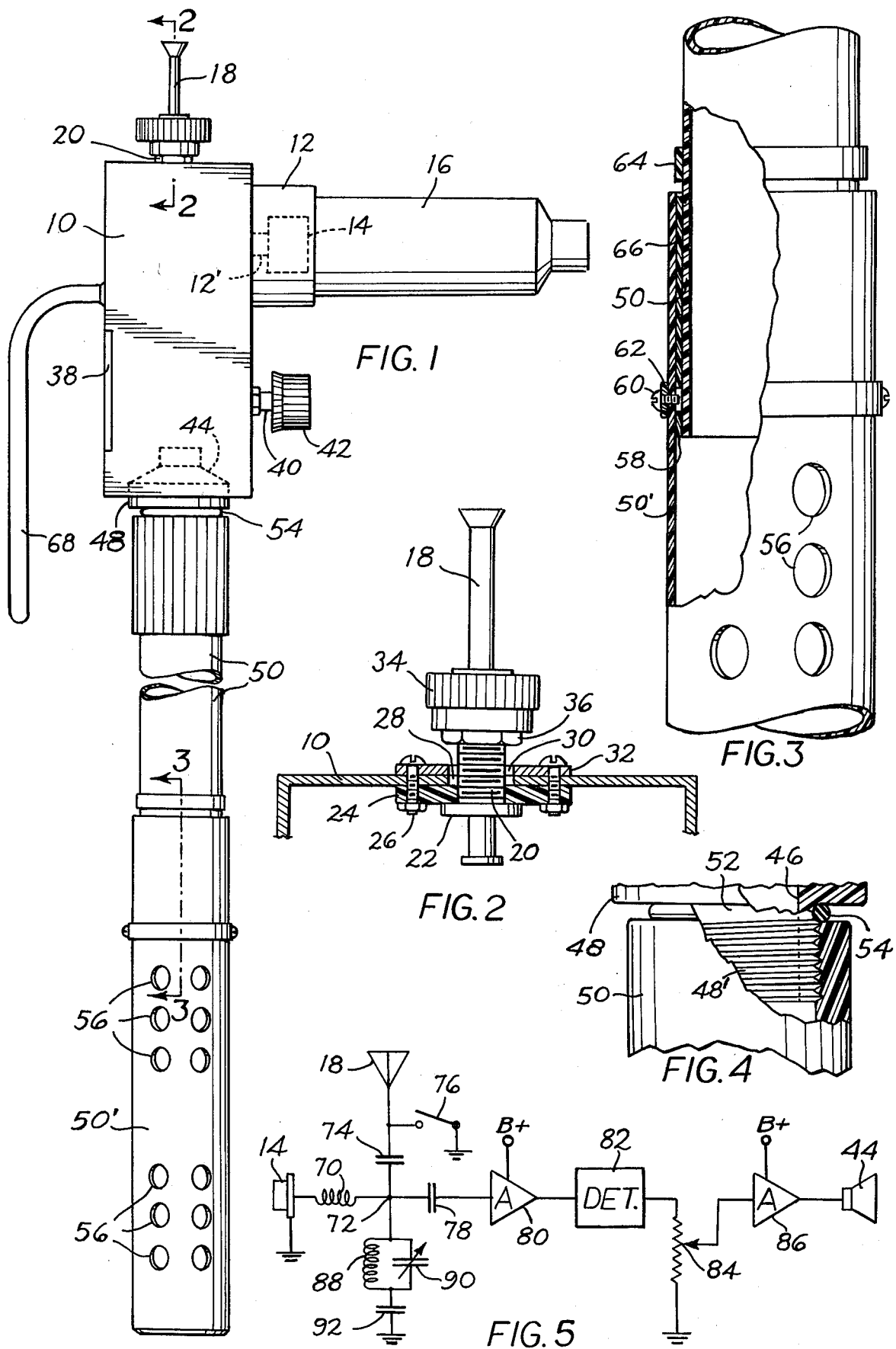

ULTRASONIC AND VHF LOCATOR OF ELECTRICAL SYSTEMS DEFECTS

BACKGROUND OF THE INVENTION

This invention relates to the detection and location of electrical defects in electric power and distribution lines, gas-filled telephone cables and associated components and equipment, and more particularly to a combination ultrasonic and VHF detector for locating such defects.

It is desirable, for example, for power company line crews and others to be able to locate defects in power lines and associated equipment and to confirm the effectiveness of maintenance or repair work done to correct the defects. Such defects as loose insulators or hardware, as well as other deficiencies associated with energized power lines, result in arcing or sparking, including corona discharge, which are not only damaging to electrical equipment but also produce ultrasonic and very high frequency emissions. The latter are sources of undesirable radio and television interference.

Ultrasonic and VHF probes have been utilized heretofore for the purpose of detecting and locating such defects as mentioned above. However, they have been provided only as separate units for use individually as alternative devices to perform the same function. Accordingly, the results have been less than completely satisfactory since each type of probe has certain inherent limitations. For example, VHF probes without expensive directional antennas are substantially non-directional and therefore require excessive operational time for pinpointing the source of a defect. On the other hand, ultrasonic probes are quite directional and therefore it is a frequent occurrence that weak ultrasonic defect sources, such as small leaks in gas-filled overhead telephone cables, or small power line sparks, are passed over.

SUMMARY OF THE INVENTION

In its basic concept, the electrical systems defect detector and locator of this invention couples a VHF antenna and an ultrasonic transducer through a common amplification, detection and audio output circuit to an audio speaker all located at the probe end of an elongated, hollow, electrically non-conductive pole for transmission of the audio sound through the hollow pole to the opposite, handle end for hearing by an operator holding and manipulating the pole by said handle end.

It is by virtue of the foregoing basic concept that the principle objective of this invention is achieved; namely, to overcome the aforementioned limitations and disadvantages of electrical defect detectors of the prior art.

Another object of this invention is the provision of an electrical systems defect detector and locator of the class described which functions rapidly first to locate the general area of a defect source by VHF sniffing and then immediately thereafter to pinpoint the defect source by ultrasonic sniffing.

Still another object of this invention is the provision of an electrical systems defect detector and locator of the class described in which the transfer from VHF sniffing to ultrasonic sniffing is accomplished with speed and facility by the simple expedient of operating an electric switch to electrically remove the VHF antenna from the electronic circuit.

A further object of this invention is to provide an electrical systems defect detector and locator of the class described in which the electronic circuitry is shielded against the detection of VHF emissions when the ultrasonic probe is in use, whereby to prevent interference with the pinpointing function.

Another object of this invention is to provide an electrical systems defect detector and locator of the class described in which a hollow, electrically non-conductive pole is used to convey audio sounds from the one end mounting the detector to the other end being held by an operator, to insure electrical isolation and protection of the operator from the hazards of the high voltage of an electrical system wherein defects are to be located.

Still another object of this invention is to provide an electrical systems defect detector and locator of the class described in which the handle portion of the elongated pole is perforated and is rotatable relative to the probe portion so that the ultrasonic transducer may be rotated to search for an electrical defect while the perforations remain directed toward the ears of the operator, whereby to insure maximum reception of sound signals even in areas of high ambient noise.

A still further object of this invention is the provision of an electrical systems defect detector and locator of the class described which affords easy exchange of ultrasonic probe tubes of different lengths for searching for defects in otherwise inaccessible places.

Another object of this invention is to provide an electrical systems defect detector and locator of the class described in which the VHF antenna includes an over-voltage gap across which to discharge high voltage in the event of contact of the antenna with high voltage, to insure protection of the electronic circuitry.

The foregoing and other objects and advantages of this invention will appear from the following detailed description, taken in connection with the accompanying drawings of a preferred embodiment.

BRIEF DESCRIPTION OF THE DRAWINGS

FIG. 1 is a foreshortened view in side elevation of an electrical systems defect detector and locator embodying the features of this invention.

FIG. 2 is a fragmentary longitudinal section, on an enlarged scale, taken on the line 2—2 in FIG. 1.

FIG. 3 is a fragmentary longitudinal section, on an enlarged scale, taken on the line 3—3 in FIG. 1.

FIG. 4 is a fragmentary vertical elevation, partly in section, of the detachable connection between the probe housing and hollow pole component of the locator.

FIG. 5 is a schematic diagram of an electrical circuit for the detector and locator illustrated in FIG. 1.

DESCRIPTION OF THE PREFERRED EMBODIMENT

The locator illustrated in the drawings includes a hollow probe housing 10 formed of front, rear, side, top and bottom walls. Although it preferably is made of aluminum, it may be made of any other suitable material, such as synthetic thermosetting or thermoplastic resin and others, preferably provided with a metal coating in order for the housing to provide VHF shielding, as described more fully hereinafter. The probe housing supports a mounting 12 and a plug-in connection 12' for an ultrasonic transducer 14, such as the model 109C microphone of Massa Corporation. As illustrated, the mount 12, connector 12' and transducer 14 project from the front wall of the housing. A hollow, electrically non-conductive probe tube 16 extends forwardly from the transducer mount. Preferably, it is attached removably to the mounting 12 by a press or screw thread fit for rapid and easy removal and replacement with probe tubes of different lengths. This facilitates searching for defects in a variety of otherwise inaccessible places.

Also mounted on the probe housing is a radio frequency short rod antenna 18 designed to receive very high frequency emissions. As illustrated, it is mounted upon and extends upwardly from the top wall of the housing. As best illustrated in FIG. 2 of the drawing, the antenna includes a brass or other electrically conductive bushing 20 through which the tubular VHF probe antenna is movable slidably for extension and retraction, in conventional manner. The bushing is provided with a collar 22 and is threaded into an electrical insulating plate 24. The plate is secured to the top wall of the probe housing, as by means of mounting screws 26.

The bushing 20 extends freely through an enlarged opening 28 in the top wall of the electrical contact plate 32 which overlies the top wall of the housing and is secured thereto by the mounting screws. The contact plate is made of brass or other metal with low contact resistance. The space between the bushing 20 and the contact plate 32, formed by the opening 30, provides an over-voltage gap across which to discharge high voltage in the event the antenna makes accidental contact with a high voltage power line. This affords protection of the electronic circuitry against the hazards of high voltage.

A control knob 34 freely encircles the antenna and is threaded onto the bushing 20 outwardly of the contact plate 32. It is provided with an electrically conductive contact collar 36 on the end of the knob facing the contact plate. The collar also is in electrical engagement with the bushing 20, and hence the antenna 18, and therefore when the knob is rotated on the bushing to bring the collar 36 into contact with the contact plate 32, the antenna is effectively shorted to the contact plate. It has been found that ordinary slide or toggle shorting switches are not completely effective in this invention for preventing VHF entry into the housing. In the event the probe housing 10 is made of aluminum or other electrical conductive material, the antenna thus is grounded to the housing. Accordingly, the housing also serves as the common ground for the electronic circuitry described hereinafter.

The electronic circuitry described hereinafter is contained within the hollow probe housing 10. Electrical power for the electronic circuitry is provided by a battery (not shown), for example a nine volt dry cell battery, also contained within the probe housing. For this purpose a battery access cover 38 is mounted removably over an opening in the rear wall of the probe housing, to facilitate replacement of the battery when needed.

The electronic circuitry also includes an audio volume control. It includes a rotary shaft 40 which extends outward through the front wall of the probe housing and is fitted with a knob 42 by which to manipulate it.

The electronic circuitry also includes an audio speaker 44. It is mounted within the probe housing on the bottom wall thereof and is arranged in registry with an opening 46 in the bottom wall for communication with an elongated hollow pole by which the locator is manipulated for searching for electrical systems defects.

As best illustrated in FIG. 4, the bottom wall of the probe housing supports an electrically non-conductive hollow downward extension 48 which includes an externally threaded fitting 48'. The fitting is arranged for removable coupling to the adjacent internally threaded end of a length of hollow tubing 50 which forms a portion of the length of the pole.

In order to facilitate unthreading of the parts, the base end of the fitting 48' is provided with an annular recess 52 which retains a resilient O-ring 54. The O-ring thus is interposed between the confronting ends of the probe housing 10 and pole 50. The resilient resistance to compression that the O-ring presents to movement of the confronting surfaces toward each other, also facilitates unthreading of the parts when disconnection is desired. In this regard, it has been observed that in the absence of the O-ring, plastic parts which are threaded together into mutual abutment tend to freeze and resist unthreading.

The bottom end of the elongated hollow pole is adapted to be grasped in the hands of an operator for manipulation of the locator. This lower end of the pole is provided with at least one opening which, by virtue of being in proximity with the hands of the operator, also is in proximity of the operator's head. Accordingly, audio sounds emanating from the speaker 44 travel the length of the elongated hollow pole and exit the opening adjacent the operator's head, and thus are heard by the operator.

In the preferred embodiment illustrated, the lower end portion of the elongated pole is provided as a separate section 50' closed at its bottom end and rotatable relative to the upper section 50. It is provided on one side with a plurality of openings 56. By this means the opening may be oriented toward the operator for maximum hearing of audible sounds while allowing the upper portion of the pole to be rotated to point the ultrasonic transducer tube 16 in any desired direction to search for an electrical systems defect.

Referring to FIG. 3 of the drawing, the upper and lower sections of the elongated hollow pole are connected together for relative rotation while preventing axial displacement. As illustrated, the lower end of the upper portion 50 of the pole is fitted with an annular stop collar 58 which is secured thereto by any suitable means. The collar is arranged to abut a plurality of circumferentially spaced stop screws 60 which extend through an annular support ring 62 secured to the outer surface of the lower pole section 50. The stop screws project radially inward of the outer pole section 50' to intercept the stop collar 58 and thus prevent axial displacement of the outer pole section longitudinally outward of the inner section 50. The lower pole section is prevented from axial movement longitudinally inward along the upper pole section 50 by means of an annular stop collar 64 secured about the upper pole section adjacent the upper end of the lower pole section. Accordingly, the lower pole section 50' may be rotated relative to the upper pole section 50 while being prevented from separation by axial displacement.

Rotational adjustment of the lower pole section is resisted frictionally by means of a plastic sheet 66 of flexible shim material wrapped around the upper pole section between the stop collars 58 and 64 and within the lower pole section. The spring tension provided by the plastic sheet inhibits rotation between the pole sections and thus assists in maintaining a position of rotational adjustment selected by the operator.

The elongated pole may be provided in any desired length. Further, additional extensions of hollow pole material may be provided in order to accommodate use of the locator for searching electrical defects in power lines which are elevated at a considerable distance above ground. Such extension sections may be interposed between the probe housing 10 and the upper end of the upper pole section 50 by such means as the threaded connections illustrated in FIG. 4.

A combination hanger and handle 68 extends rearwardly from the rear wall of the probe housing 10 and thence downwardly, to provide convenient means by which to carry the housing assembly in the tool belt of the operator while climbing a pole, or for hanging the housing assembly on a cross arm brace or other structural member.

Referring now to the FIG. 5 of the drawing: The ultrasonic transducer 14 is shown to be connected to common circuit ground and also through a radio frequency choke 70 to a terminal 72. The VHF antenna 18 also is connected to terminal 72 through a capacitor 74 which blocks ultrasonic frequencies but passes very high frequencies. The choke allows the electric signal output from the ultrasonic transducer to pass to terminal 72 but prevents VHF signals from the antenna from passing to ground through the transducer.

The VHF antenna 18 may be shorted to common circuit ground through the shorting switch 76. In the mechanical embodiment illustrated in FIGS. 1 and 2, this switch is provided by the collar 36 of control knob 34. Thus, when the control knob is screwed down on the bushing 20 until the collar 36 engages the contact 32, the antenna 18 is shorted to ground. This is desired when the ultrasonic transducer 14 is to be employed to pinpoint an electrical defect.

The common terminal 72 is connected through a capacitor 78 to the input of an IF amplifier 80 the amplified output of which is connected to the input of a detector 82 which converts the radio frequency signals to audio frequency signals. The audio frequency signals are connected through the volume control 84 to the input of an audio amplifier 86 the output of which is connected to the audio speaker 44.

Also connected to the terminal 72 is one end of a tuned circuit formed of inductor coil 88 and variable condenser 90. The opposite end of the tuned circuit is connected through capacitor 92 to common ground. The tuned circuit is adjusted to limit the high frequency signals passed to the amplifier 80 to the range of about 90 mHz to about 110 mHz for maximum effectiveness. Capacitor 92 functions to prevent passage of the output signals from the transducer 14 to ground, thereby insuring that substantially all such signals are passed on to the amplifier 80. It will be understood that the choke 70 may be connected between the tuned circuit and the capacitor 92, rather than to terminal 72.

In the operation of the locator described hereinbefore, it is desirable first to scan a broad area is search of an electrical systems defect. This is achieved by use of the non-directional VHF antenna 18, and is accomplished by unthreading the control knob 34 to open the shorting switch 76. When the operator hears noise emanating from the openings 56 in the lower, handle portion 50' of the elongated pole, the operator is aware that a source of electrical defect is close at hand. The operator then turns down the control knob 34 to engage collar 36 with contact plate 32. This closes the switch 76 and shorts the VHF antenna 18. Only the ultrasonic probe now is operable. Since the ultrasonic probe is quite directional, the operator quickly locates the source of electrical defect by noting the position of the ultrasonic transducer probe tube 16 when maximum noise is heard from the speaker output.

It will be apparent to those skilled in the art that various changes may be made in the size, shape, type, number and arrangement of parts described hereinbefore without departing from the spirit of this invention and the scope of the appended claims.

Having now described by invention and the manner in which it may be used, I claim:

1. An electrical systems defect locator, comprising:
   a. a probe housing,
   b. an ultrasonic transducer on the probe housing for receiving ultrasonic emissions and converting them to electrical output signals,
   c. a VHF antenna on the probe housing for receiving VHF emissions
   d. converter means on the probe housing for converting said electric output signals and VHF emissions to electric audio frequency signals,
   e. an audio speaker on the probe housing connected to the output of the converter means, and
   f. an elongated, hollow, electrically non-conductive pole connected at one end to the probe housing and communicating with the speaker,
   g. the opposite end portion of the pole being arranged for grasping by the hands of an operator and having an opening therethrough for the exit of audible sound from the speaker.

2. The electrical systems defect locator of claim 1 including switch means associated with the VHF antenna for removing VHF signals from the converter means when searching for ultrasonic emissions.

3. The electrical systems defect locator of claim 2 wherein the switch means is arranged to short the antenna to common electric circuit ground.

4. The electrical systems defect locator of claim 3 wherein the switch means comprises an electrically conductive threaded bushing slidable supporting the antenna and separated electrically from the common electric circuit ground, a knob threaded onto the bushing and having an electrically conductive portion engaging the bushing and arranged upon rotation to removably engage the common electric circuit ground.

5. The electrical systems defect locator of claim 1 including means associated with the antenna for limiting the VHF input signals to the converter means to a frequency range of from about 90 mHz to about 110 mHz.

6. The electrical systems defect locator of claim 5 wherein the frequency limiting means comprises a tuned circuit connected between the antenna and common electric circuit ground.

7. The electrical systems defect locator of claim 1 including means providing a spark gap between the antenna and ground for discharging high voltage contacted by the antenna.

8. The electrical systems defect locator of claim 1 wherein the pole comprises two longitudinal sections interconnected for rotation one relative to the other, the section including the said opposite end portion having said opening through a side thereof, whereby to allow adjustment of the said opening and the ultrasonic transducer to any desired position of rotation relative to each other.

9. The electrical systems defect locator of claim 1 including:
   a. switch means associated with the VHF antenna for removing VHF signals from the couverter means when searching for ultrasonic emissions,
   b. means associated with the antenna for limiting the VHF input signals to the converter to a frequency range of from about 90 mHz to about 110 mHz, and
   c. means providing a spark gap between the antenna and ground for discharging high voltage contacted by the antenna,
   d. the pole comprising two longitudinal sections interconnected for rotation one relative to the other, the section including the said opposite end portion having said opening through a side thereof, whereby to allow adjustment of the said opening and the ultrasonic transducer to any desired position of rotation relative to each other.

10. The electrical systems defect locator of claim 9 wherein the switch means is arranged to short the antenna to common electric circuit ground and the frequency limiting means comprises a tuned circuit connected between the antenna and common electric ground.

11. An electrical systems defect locator, comprising:
   a. a probe housing,
   b. an ultrasonic transducer on the probe housing for receiving ultrasonic emissions and converting them to electrical output signals,
   c. converter means on the probe housing for converting said electric output signals to electric audio frequency signals,
   d. an audio speaker on the probe housing connected to the output of the converter means, and
   e. an elongated, hollow, electrically non-conductive pole connected at one end to the probe housing and communicating with the speaker,
   f. the opposite end portion of the pole being arranged for grasping by the hands of an operator and having an opening therethrough for the exit of audible sound from the speaker.

12. An electrical systems defect locator, comprising:
   a. a probe housing,
   b. a VHF antenna on the probe housing for receiving VHF emissions,
   c. converter means on the probe housing for converting said VHF emissions to electric audio frequency signals,
   an audio speaker on the probe housing connected to the output of the converter means, and
   e. an elongated, hollow, electrically non-conductive pole connected at one end to the probe housing and communicating with the speaker,
   f. the opposite end portion of the pole being arranged for grasping by the hands of an operator and having an opening therethrough for the exit of audible sound from the speaker.

* * * * *